(12) United States Patent
Kutsuna

(10) Patent No.: US 12,341,437 B2
(45) Date of Patent: Jun. 24, 2025

(54) SMOOTHING CIRCUIT FOR INVERTER AND INVERTER FOR AIRCRAFT

(71) Applicant: SINFONIA TECHNOLOGY CO., LTD., Tokyo (JP)

(72) Inventor: Masashi Kutsuna, Tokyo (JP)

(73) Assignee: SINFONIA TECHNOLOGY CO., LTD., Tokyo (JP)

(*) Notice: Subject to any disclaimer, the term of this patent is extended or adjusted under 35 U.S.C. 154(b) by 533 days.

(21) Appl. No.: 17/496,015

(22) Filed: Oct. 7, 2021

(65) Prior Publication Data
US 2022/0123663 A1   Apr. 21, 2022

(30) Foreign Application Priority Data
Oct. 20, 2020   (JP) .................. 2020-176151

(51) Int. Cl.
*H02M 1/14*   (2006.01)
*H02M 7/00*   (2006.01)
*H02P 27/06*  (2006.01)

(52) U.S. Cl.
CPC ............ *H02M 7/003* (2013.01); *H02M 1/14* (2013.01); *H02P 27/06* (2013.01)

(58) Field of Classification Search
CPC .. H01G 2/02; H01G 2/06; H01G 2/08; H01G 4/38; H02M 1/14; H02M 7/003; H02M 7/00; H02M 1/32; H02M 7/53875; H02P 27/06; H02P 2201/03; H02P 25/22; H02P 29/028; H02P 29/50; H05K 7/14329; H05K 7/209; H05K 1/0203; H05K 1/181; H05K 2201/066; H05K 2201/10015; B60L 15/007; B60L 15/20; B60L 2210/40; B60L 50/51; B60L 50/60

USPC .......................................... 361/807; 318/139
See application file for complete search history.

(56) References Cited

U.S. PATENT DOCUMENTS

| | | |
|---|---|---|
| 8,674,636 B2 | 3/2014 | Matsuo et al. |
| 9,159,506 B2 | 10/2015 | Matsuo et al. |
| 11,088,649 B2 | 8/2021 | Kitamura et al. |

(Continued)

FOREIGN PATENT DOCUMENTS

| | | | | |
|---|---|---|---|---|
| JP | 07288296 A | * | 10/1995 | ............. H01L 23/12 |
| JP | 2006223100 A | * | 8/2006 | ............. H02M 1/12 |

(Continued)

OTHER PUBLICATIONS

Extended European Search Report dated Mar. 11, 2022, issued in counterpart EP application No. 21200653.0. (10 pages).

(Continued)

*Primary Examiner* — Timothy J Thompson
*Assistant Examiner* — Guillermo J Egoavil
(74) *Attorney, Agent, or Firm* — WHDA, LLP

(57) ABSTRACT

A smoothing circuit 2 for an inverter includes a parallel flat plate 21, a plurality of capacitors 22 arranged in a matrix and mounted on the parallel flat plate 21, and a thermal conductive sheet 23 interposed between the parallel flat plate 21 and a housing 4 in an area overlapping a mounting area 21c of the plurality of capacitors 22 when viewed along a normal direction of the parallel flat plate 21. The plurality of capacitors 22 are arranged in such a manner that adjacent terminals 221 of adjacent capacitors 22 have a same polarity in a row direction and a column direction.

15 Claims, 7 Drawing Sheets

(56) References Cited

U.S. PATENT DOCUMENTS

| | | | |
|---|---|---|---|
| 2006/0087028 A1* | 4/2006 | Goto | H01L 23/50 |
| | | | 257/E23.079 |
| 2011/0199800 A1* | 8/2011 | Yahata | B60L 3/003 |
| | | | 363/131 |
| 2016/0029478 A1* | 1/2016 | Bayerer | H05K 1/181 |
| | | | 361/736 |
| 2017/0055366 A1* | 2/2017 | Backhaus | H01L 23/3675 |
| 2020/0036283 A1* | 1/2020 | Cho | H05K 7/14322 |
| 2020/0195189 A1* | 6/2020 | Kitamura | B60L 50/51 |
| 2021/0254491 A1* | 8/2021 | Del | F01D 5/025 |
| 2021/0274678 A1* | 9/2021 | Nozuki | H05K 7/209 |

FOREIGN PATENT DOCUMENTS

| | | | | |
|---|---|---|---|---|
| JP | 2007-189869 A | 7/2007 | | |
| JP | 2010-110065 A | 5/2010 | | |
| JP | 2020-57507 A | 4/2020 | | |
| JP | 2020057507 A * | 4/2020 | | B32B 27/18 |
| WO | 2018/198290 A1 | 11/2018 | | |

OTHER PUBLICATIONS

Office Action dated Apr. 2, 2024, issued in counterpart JP application No. 2020-176151 with English translation. (9 pages).

Office Action dated Aug. 27, 2024, issued in counterpart JP application No. 2020-176151 with English translation. (7 pages).

Office Action dated Feb. 3, 2025, issued in counterpart European patent application No. 21200653.0 (7 pages).

* cited by examiner

SMOOTHING CIRCUIT FOR INVERTER AND INVERTER FOR AIRCRAFT

CROSS-REFERENCE TO RELATED APPLICATIONS

This application claims priority of Japanese Patent Applications No. 2020-176151 filed on Oct. 20, 2020. The contents of the applications are incorporated herein by reference in their entirety.

BACKGROUND

Field of the Invention

The present invention relates to a smoothing circuit for an inverter, and in particular to a smoothing circuit suitable for an inverter for an aircraft and an inverter for an aircraft including same.

Description of the Related Documents

As is well known, an inverter includes a rectifier circuit that rectifies alternating current power given from an alternating current power supply to generate direct current power, a smoothing circuit that smoothes the generated direct current power, an inverse conversion circuit that converts the smoothed direct current power into alternating current power by switching, and the like.

Various forms of thermal countermeasures can be taken on the inverter as required. For example, Japanese Unexamined Patent Application Publication No. 2007-189869 discloses a configuration in which a semiconductor module is mounted on a heat sink and the heat generated in the semiconductor module is dissipated by exposing the fins on the heat sink to outside air supplied by a fan. In addition, a smoothing capacitor is located on the opposite side of the fan, with the heat sink sandwiched, and the outside air from the fan hits the capacitor downstream of the heat sink, which thereby also promotes the heat dissipation of the capacitor.

In recent years, the development of the technology to motorize a fan motor for propulsion of an aircraft has been advanced. In motorization of a fan motor for propulsion, an inverter is required to drive the fan motor.

Since the amount of current flowing through an inverter for an aircraft is much larger than that of an inverter for a vehicle, for example, the loss generated by the smoothing capacitor is also larger. Therefore, a thermal countermeasure such as that indicated in Japanese Unexamined Patent Application Publication No. 2007-189869 in which the capacitor is cooled incidentally with a fan for cooling the semiconductor module is not considered to be sufficient.

Therefore, as a thermal countermeasure for the smoothing capacitor in the inverter for an aircraft, it can be considered that a thermal conductive sheet made of a TIM (Thermal Interface Material) is arranged between a parallel flat plate on which the capacitor is mounted and a housing. According to this configuration, the heat generated by the capacitor and the parallel flat plate can be quickly transferred to the housing and dissipated to the outside.

However, in the case of an inverter for an aircraft, there is a major issue in adopting a thermal countermeasure using a thermal conductive sheet. Because, while weight reduction is strongly required for all parts installed in the aircraft, the inverter to drive the fan motor for propulsion is not an exception, and weight reduction in gram units is strongly required. However, in a case where a thermal conductive sheet is provided for a thermal countermeasure for a smoothing capacitor, a thermal conductive sheet of a size that covers the entire mounting area of the capacitor is required, and an increase in mass corresponding to the size of the sheet is unavoidable. In particular, the number of capacitors mounted in an inverter for an aircraft is large because the required capacitor capacity is orders of magnitude larger than that of an inverter for a vehicle. In other words, the mounting area of a group of capacitors is also large. Consequently, the required size of the thermal conductive sheet, and thus the mass increase resulting from the provision of the thermal conductive sheet will increase.

The present invention has been made in order to solve the above issue, and an object of the present invention is to provide a smoothing circuit for an inverter, which has sufficient cooling performance while suppressing mass increase.

SUMMARY

The present invention has implemented the following means in order to achieve the above object.

More specifically, the present invention is a smoothing circuit for an inverter and includes a parallel flat plate, a plurality of capacitors arranged in a matrix and mounted on the parallel flat plate, and a thermal conductive sheet interposed between the parallel flat plate and a housing in an area overlapping a mounting area c of the plurality of capacitors when viewed along a normal direction of the parallel flat plate. The plurality of capacitors are arranged in such a manner that adjacent terminals of adjacent capacitors have a same polarity in a row direction and a column direction.

For example, in a case where all of the plurality of capacitors are arranged in a matrix with the same posture, as illustrated in FIG. 7, adjacent terminals 91 of adjacent capacitors 9 in any one of the row direction or column direction (in the example of FIG. 7, the column direction) have an opposite polarity. In this case, it is necessary to provide, with respect to the direction, a separation distance of a predetermined insulation distance d1 or more between adjacent terminals 91 of the capacitor 9 to ensure the insulation between the different pole terminals. In contrast, in the above configuration, the plurality of capacitors are arranged in such a manner that adjacent terminals of adjacent capacitors have a same polarity in both the row direction and the column direction. According to this configuration, it is not necessary to provide such a separation distance of more than a predetermined insulation distance d1 between the terminal of the adjacent capacitors in both the row direction and the column direction, and the provision of a separation distance of more than a predetermined insulation distance d2 for securing insulation between same pole terminals is sufficient (needless to say, "d1>d2"). Accordingly, the density of the plurality of capacitors can be increased, and the mounting area of the plurality of capacitors can be kept small. This makes it possible to keep the size of the thermal conductive sheet, and thus possible to keep the mass increase resulting from the provision of the thermal conductive sheet to be small. Therefore, sufficient cooling performance can be achieved while suppressing mass increase.

Preferably, in the smoothing circuit for an inverter, the thermal conductive sheet includes a plurality of sheet pieces having different thermal conductivities, and a sheet piece having a relatively high thermal conductivity is disposed in an area where an amount of heat generated is relatively large.

In a case where the thermal conductivity of the thermal conductive sheet is specified by the content rate of the thermal conductive filler or the like, the higher the thermal conductivity, the larger the mass. In the above configuration, since the sheet piece having a relatively low thermal conductivity is disposed in the area having a relatively small amount of heat generation among the areas overlapping the mounting area, the total mass of the thermal conductive sheet can be suppressed compared to a case, for example, where a thermal conductive sheet having the thermal conductivity assuming an area having a relatively large amount of heat generation is uniformly disposed in the entire area overlapping the mounting area. In addition, since a plurality of sheet pieces having different thermal conductivities are used in accordance with the amount of heat generated in each of the areas, heat is more easily transferred to the housing in the area where the amount of heat generated is larger, and the unevenness in the amount of heat generated in the plane of the parallel flat plate is canceled out and the uniformity of the in-plane temperature of the parallel flat plate is enhanced. By increasing the uniformity of the in-plane temperature of the parallel flat plate, it is possible to make the life of the plurality of capacitors mounted thereon uniform, thereby improving the reliability of the product.

Preferably, in the smoothing circuit for an inverter, a sheet piece having a relatively high thermal conductivity is disposed in an area near a connection portion where the parallel flat plate and a semiconductor module are connected.

Since the semiconductor module tends to generate a larger amount of heat compared to the capacitor, the vicinity of the semiconductor module tends to receive heat from this and to heat up. In addition, when an alternating current flows between the connection portion of the semiconductor module and the parallel flat plate, a loss corresponding to the effective value of the alternating current is generated therein, and thus the temperature of the connection portion and its vicinity is likely to rise. According to the above configuration, since the sheet piece having a relatively high thermal conductivity is disposed in an area near the connection portion where the parallel flat plate and the semiconductor module are connected, it is possible to effectively dissipate the heat generated in the near area.

Preferably, in the smoothing circuit for an inverter, the plurality of capacitors are of a same type as each other, and a sheet piece having a relatively high thermal conductivity is disposed in an area corresponding to an area where a capacitor surrounded by other capacitors is mounted.

As described above, the plurality of capacitors are arranged in such a manner that the adjacent terminals of the adjacent capacitors have the same polarity in both the row direction and the column direction, and it is thereby possible to increase the density of the plurality of capacitors. However, when the density of the plurality of capacitors is increased, it becomes difficult for the heat generated by the capacitor surrounded by other capacitors to be dissipated to the surroundings. According to the above configuration, since the sheet piece having a relatively high thermal conductivity is disposed in an area corresponding to the area where such a capacitor is mounted, it is possible to effectively dissipate the heat generated in such a capacitor.

Preferably, in the smoothing circuit for an inverter, a thermal conductivity of each of the plurality of sheet pieces is specified on a basis of an amount of heat generated in an area where the sheet pieces are disposed.

According to this configuration, the unevenness in the amount of heat generated in the plane of the parallel flat plate is appropriately canceled out, and thus the uniformity of the in-plane temperature of the parallel flat plate is sufficiently enhanced.

In addition, the present invention is also directed to an inverter for an aircraft, which includes the smoothing circuit for an inverter.

While high cooling performance is required for the inverter for an aircraft, weight reduction is also strongly required. The above smoothing circuit for an inverter can meet both of these requirements because sufficient cooling performance is achieved while suppressing the mass increase.

According to the present invention, a smoothing circuit for an inverter, which has sufficient cooling performance while suppressing mass increase can be obtained.

DETAILED DESCRIPTION

Hereinafter, an embodiment of the present invention is described with reference to the drawings.

<Configuration of Smoothing Circuit>

Figure 1:
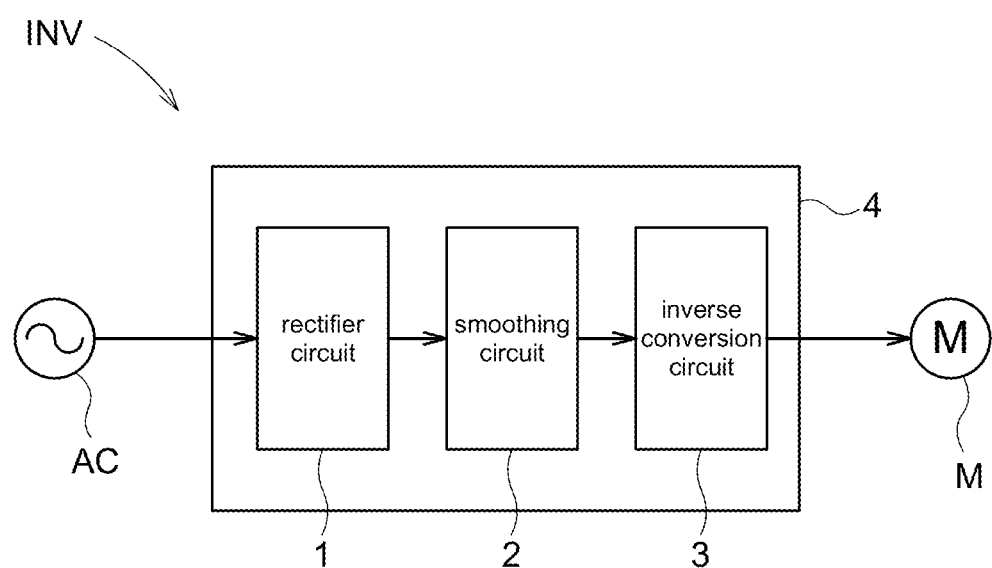
FIG. 1 is a block diagram of an inverter including a smoothing circuit according to an embodiment.
Figure 2:
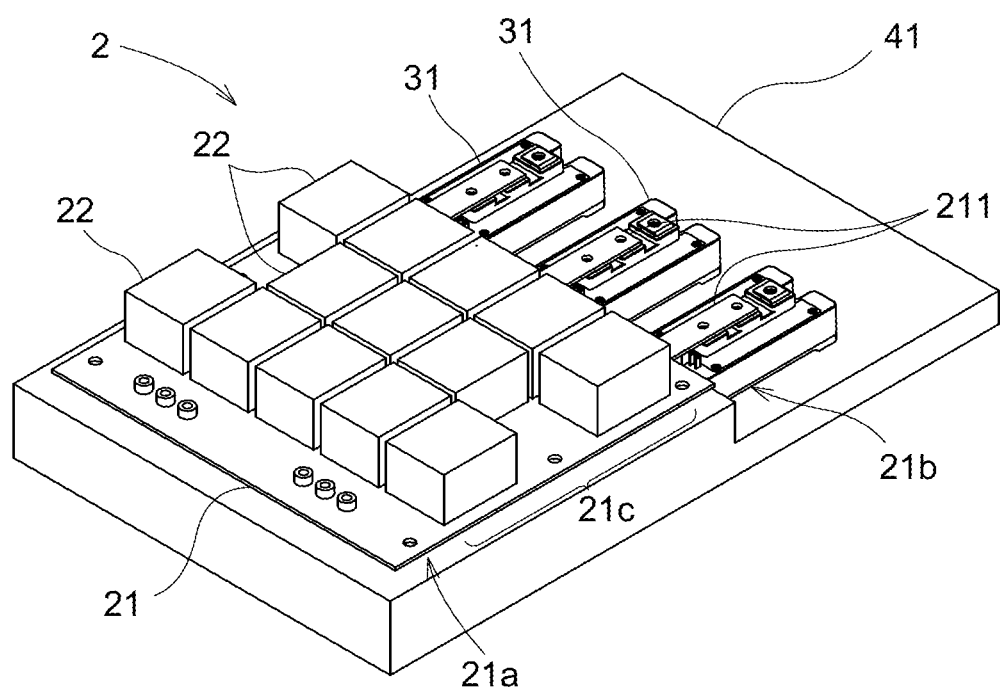
FIG. 2 is a perspective view of the smoothing circuit.
Figure 3:
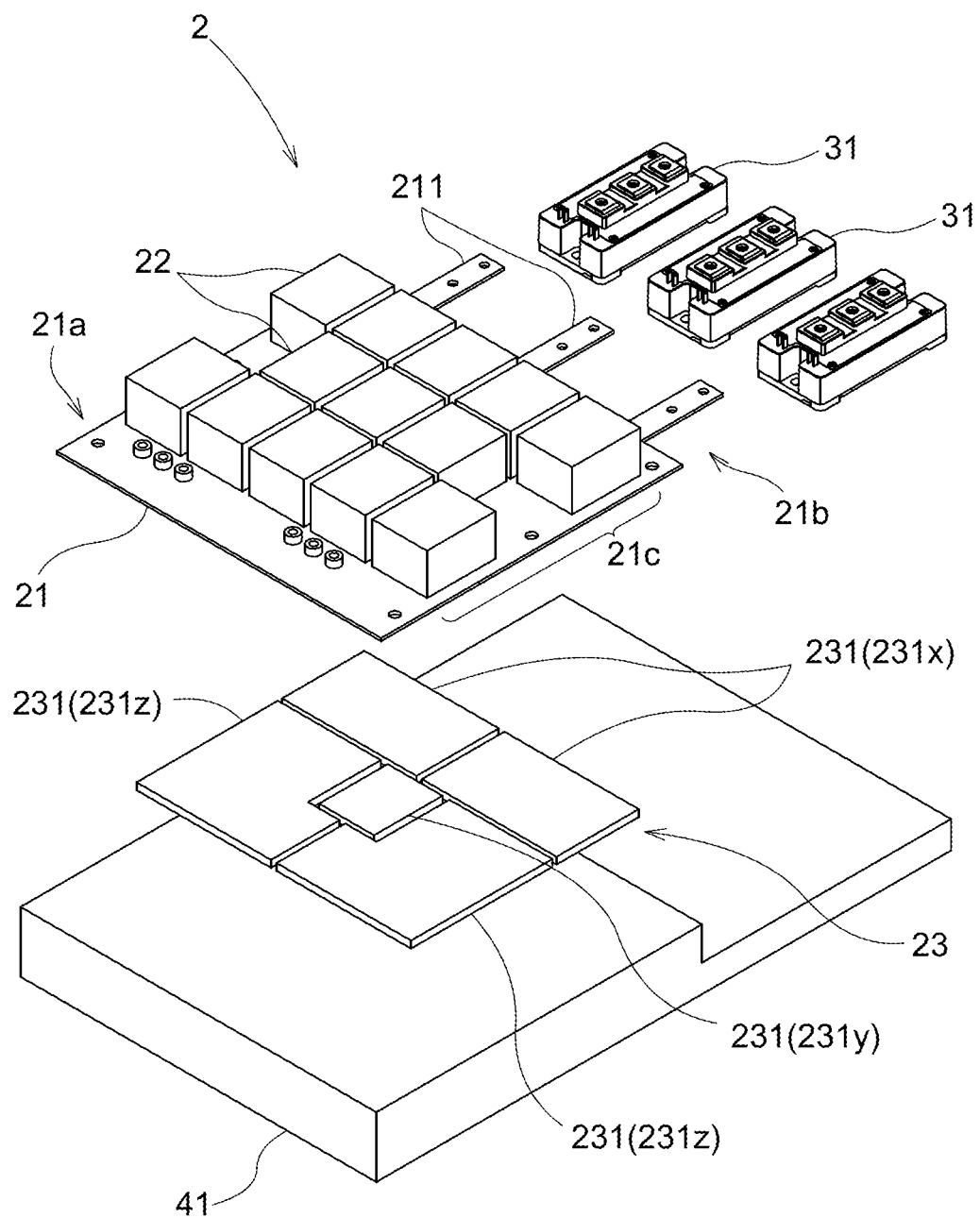
FIG. 3 is an exploded view of the smoothing circuit.
Figure 4:
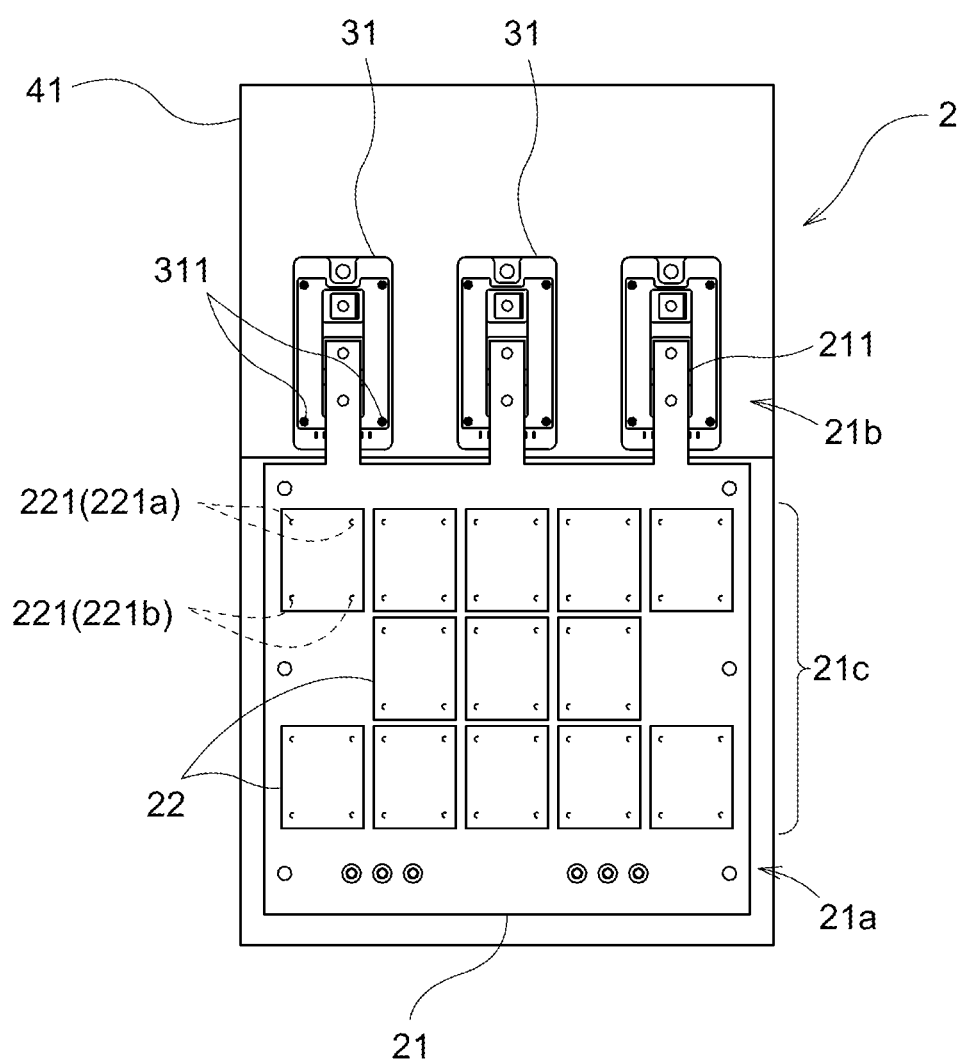
FIG. 4 is a plane view of the smoothing circuit.

A configuration of a smoothing circuit according to the embodiment will be described with reference to FIGS. 1 to 4. FIG. 1 is a block diagram of an inverter INV in which a smoothing circuit 2 is provided. FIGS. 2, 3, and 4 are a perspective view, an exploded view, and a plan view of the smoothing circuit 2, respectively.

The smoothing circuit 2 is a smoothing circuit for an inverter, and is mounted on an inverter INV for an aircraft, specifically, for example, an inverter INV for driving a fan motor for propulsion M of an aircraft. As illustrated in FIG. 1, this inverter INV includes a rectifier circuit 1, the smoothing circuit 2, and an inverse conversion circuit 3, and each of these parts 1 to 3 is housed in a housing 4. The rectifier circuit 1 is connected to an alternating current power supply AC, and rectifies the alternating current power given from the alternating current power supply AC to generate direct current power and outputs same to the smoothing circuit 2. The smoothing circuit 2 smoothes the direct current power given by the rectifier circuit 1 and gives same to the inverse conversion circuit 3. The inverse conversion circuit 3 includes a switching element and the like, converts the direct current power given by the smoothing circuit 2 into alternating current power by switching, and outputs same to the fan motor for propulsion M of the aircraft. Since the configuration of the inverter INV is well known, a detailed explanation is omitted.

The smoothing circuit 2 includes a parallel flat plate 21, a plurality of capacitors (smoothing capacitors) 22, and a thermal conductive sheet 23, as illustrated in FIGS. 2 to 4.

(Parallel Flat Plate 21)

The parallel flat plate 21 includes, for example, a laminated busbar capable of handling high currents. The parallel flat plate 21 has a substantially rectangular shape in plan view. A connection area (first connection area) 21a to which the rectifier circuit 1 is connected is provided on one end side of the pair of facing end sides of the parallel flat plate 21. A connection area (second connection area) 21b to which the inverse conversion circuit 3 is connected is provided on the other end side of the parallel flat plate 21. However, the second connection area 21b is provided with a plurality of connection pieces 211 extending out to form a comb-tooth shape as a whole, and a semiconductor module 31 such as an IGBT which is a component of the inverse conversion circuit 3 is connected to each of the connection pieces 211. The area excluding the respective connection areas 21a and 21b is a mounting area 21c of the plurality of capacitors 22, and the plurality of capacitors 22 are mounted on the mounting area 21c.

(Capacitors 22)

The plurality of capacitors 22 are the same kind of capacitors as each other, and includes, for example, film capacitors for mounting on a printed circuit board. As illustrated in FIG. 4, one or more pairs of terminals (terminal electrodes) 221 are provided on the lower surface of the capacitor 22 (two pairs in the example of the figure), and one of a pairs of terminals 221 is connected to the high voltage side and the other is connected to the low voltage side. When distinguishing between the two terminals 221, the terminal 221 connected to the high voltage side and serving as the positive electrode side is called a "positive terminal 221a", and the terminal 221 connected to the low voltage side and serving as the negative electrode side is called a "negative terminal 221b".

Figure 5:
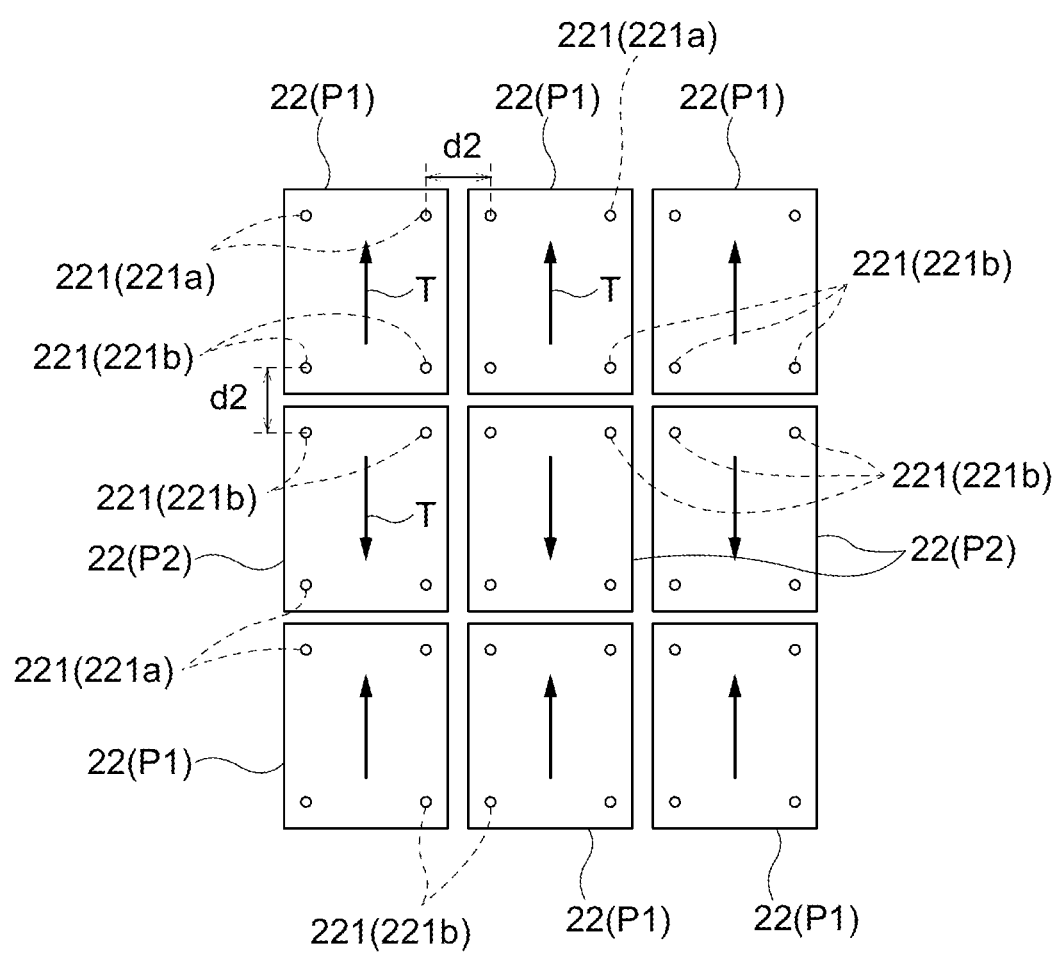
FIG. 5 is a diagram for explaining an arrangement mode of a plurality of capacitors.

Here, an arrangement mode of the plurality of capacitors 22 will be described in more detail with reference to FIG. 5 in addition to FIGS. 2 to 4. FIG. 5 is a diagram for explaining the arrangement mode.

Now, if the direction parallel to the extending direction of the respective connection areas 21a and 21b and in the plane of the parallel flat plate 21 is defined as a row direction and the direction orthogonal to the row direction and in the plane of the parallel flat plate 21 is defined as a column direction, the plurality of capacitors 22 are arranged in a matrix along the row direction and the column direction and mounted on the parallel flat plate 21.

In addition, each of the capacitors 22 is arranged in a posture (first posture) P1 within the capacitor such that an axial direction T from the negative terminal 221b to the positive terminal 221a is along the column direction and the negative terminal 221b is directed toward the side of the first connection area 21a, or in an opposite posture, that is, a posture (second posture) P2 within the capacitor such that the axial direction T is along the column direction and the positive terminal 221a is directed toward the first connection area 21a. The capacitors 22 adjacent to each other in the row direction have the same posture as each other, and the capacitors 22 adjacent to each other in the column direction have the opposite postures to each other. By arranging each of the capacitors 22 in such a posture, the plurality of capacitors 22 are arranged in such a manner that adjacent terminals 221 of the adjacent capacitors 22 have a same polarity in both the row direction and the column direction.

According to such an arrangement mode, it is not necessary to provide, between adjacent capacitors 22 in both the row direction and the column direction, a separation distance of more than a predetermined insulation distance d1 (see FIG. 7) for securing insulation between different pole terminals, and the provision of a separation distance of more than a predetermined insulation distance d2 for securing insulation between same pole terminals is sufficient (needless to say, "d1>d2"). Accordingly, the density of the plurality of capacitors 22 can be increased, and the area of the mounting area 21c required for mounting the plurality of capacitors 22 can be kept small.

(Thermal Conductive Sheet 23)

Again, FIGS. 2 to 4. will be referred. As illustrated in FIG. 3, the thermal conductive sheet 23 is interposed between the parallel flat plate 21 and the housing 4 (specifically, a bottom surface 41 of the housing 4) in an area overlapping the mounting area 21c when viewed along the normal direction of the parallel flat plate 21. Specifically, the thermal conductive sheet 23 is disposed between the parallel flat plate 21 and the bottom surface 41 of the housing 4, and is provided in contact with the parallel flat plate 21 on the entire upper surface and in contact with the bottom surface 41 on the entire lower surface. By providing the thermal conductive sheet 23 between the parallel flat plate 21 and the housing 4, the heat generated by the capacitor 22 and the parallel flat plate 21 is quickly transferred to the housing 4. The housing 4 is formed of a material (e.g., aluminum) with sufficiently high thermal conductivity, and thus heat transferred to the housing 4 is quickly dissipated to the outside.

The thermal conductive sheet 23 is made of a TIM (Thermal Interface Material). TIM is, for example, a substance in which a thermally conductive additive (filler) is mixed with an insulating base material such as a silicone polymer. The higher the content of the additive, the higher the thermal conductivity. Alumina, silica, silicon nitride, and the like are used as the additive.

The thermal conductive sheet 23 includes a plurality of sheet pieces 231. The plurality of sheet pieces 231 include those having different thermal conductivities from each other, and a sheet piece 231 having a relatively high thermal conductivity is disposed in an area where the amount of heat generated is relatively large, and a sheet piece 231 having a relatively low thermal conductivity is disposed in an area where the amount of heat generated is relatively small. Specifically, an area where the thermal conductive sheet 23 is to be disposed (i.e., the area overlapping the mounting area 21c viewed along the normal direction of the parallel flat plate 21) is divided into a plurality of different areas in accordance with the amount of heat generated. In each of the divided areas, a sheet piece 231 having a thermal conductivity specified in accordance with the amount of heat generated in the area is disposed.

Figure 6:
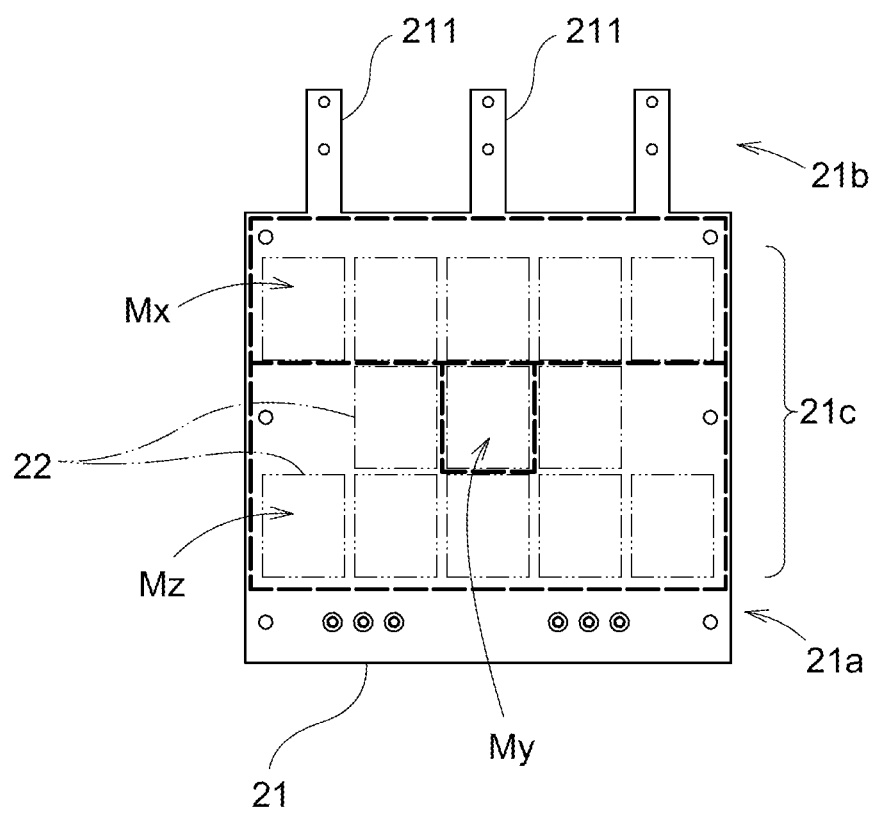
FIG. 6 is a diagram for explaining a mode in which an area where a thermal conductive sheet is arranged is divided in accordance with an amount of heat generated.

Here, one embodiment to divide the area where the thermal conductive sheet 23 is disposed in accordance with the amount of heat generated will be specifically described with reference to FIG. 6. FIG. 6 is a diagram for explaining this embodiment.

If a sheet piece 231 having equal thermal conductivity is uniformly provided over the entire area overlapping the mounting area 21c viewed along the normal direction of the parallel flat plate 21 (or if no thermal conductive sheet 23 is provided), the closer to the second connection area 21b to which the semiconductor module 31 is connected (that is, the closer to the connection piece 211), the in-plane temperature of the parallel flat plate 21 tends to be higher. Furthermore, among the plurality of capacitors 22 arranged in a matrix, the area where the capacitor 22 surrounded by other capacitors 22 is mounted and the area in the vicinity thereof also tend to become hot.

One of the reasons for the appearance of the tendency for the temperature to be higher as the area gets closer to the second connection area 21b is thought to be the generation loss that occurs as an alternating current flows. That is, when an alternating current flows between the semiconductor module 31 and the parallel flat plate 21, a loss corresponding to the effective value of the alternating current is generated therein. In particular, as illustrated in FIG. 4, in a case where the connection piece 211 is made in a narrow shape to expose a signal connection portion 311 provided in the semiconductor module 31 (i.e., a signal connection portion 311 for connecting the signal line for inputting a signal to the semiconductor module 31), the current density at the connection piece 211 is high, and thus the generation loss here is likely to be particularly large. Furthermore, when the temperature of the copper foil provided on the parallel flat plate 21 rises under the influence of the generation loss, or the like, there is also a vicious cycle in which the resistance of the copper foil increases, and the generation loss becomes even larger. For these reasons, it is considered that the closer to the second connection area 21b, the higher the temperature tends to be.

In addition, the semiconductor module 31 connected to the second connection area 21b generates a larger amount of heat compared to the capacitor 22, and the connection piece 211 to which the semiconductor module 31 is connected and the area in the vicinity thereof are also heated up by receiving heat from the semiconductor module 31 which is relatively high in temperature. This is considered to be one of the reasons why the closer to the second connection area 21b, the higher the temperature tends to be.

On the other hand, the reason why the area where the capacitor 22 surrounded by other capacitors 22 is mounted and the area in the vicinity thereof appear to have a tendency to become hot is considered to be that the heat generated by the capacitor 22 surrounded by other capacitors 22 is difficult to be dissipated. Needless to say, heat dissipation of the capacitor 22 becomes more difficult as the number of the capacitors 22 around the capacitor 22 increases. In other words, in a case where a plurality of capacitors 22 are arranged in a matrix, the capacitor 22 that is sandwiched by another capacitor 22 from all directions (row direction, column direction, and diagonal direction), that is, the capacitor 22 that is surrounded by eight capacitors 22, is the most difficult to dissipate heat. In particular, since the density of the plurality of capacitors 22 is increased by arranging the capacitors 22 in such a manner that the polarity of the adjacent terminals 221 of the adjacent capacitors 22 in both the row direction and the column direction is the same, the heat dissipation of the capacitor 22 surrounded by other capacitors 22 is particularly likely to be inhibited. As a result, the area where such capacitor 22 is mounted is particularly likely to become hot.

On the basis of these tendencies, in this embodiment, the area where the thermal conductive sheet 23 is disposed is divided into three types of areas in accordance with the amount of heat generated; namely a first area Mx, a second area My, and a third area Mz.

The first area Mx is an area corresponding to the vicinity of the second connection portion 21b (i.e., the portion in which the connection piece 211 is provided) to which the semiconductor module 31 is connected. Here, the gap between the capacitor 22 in the first row and the capacitor 22 in the second row counted from the side of the connection piece 211 is defined as a boundary, and the area on the side of the connection piece 211 from this boundary is defined as the first area Mx.

The second area My is an area corresponding to an area where a capacitor 22 surrounded by other capacitors 22 is mounted (i.e., an area overlapping with an area where such a capacitor 22 is mounted when viewed along the normal direction of the parallel flat plate 21). However, here, the capacitor 22 that is sandwiched by another capacitor 22 from all directions (row direction, column direction, and diagonal direction), that is, the capacitor 22 that is surrounded by eight capacitors 22, is defined as "the capacitor 22 surrounded by other capacitors 22".

The third area Mz is an area excluding the first area Mx and the second area My.

In each of the three types of areas Mx, My, and Mz thus defined, the sheet piece 231 having a thermal conductivity defined in accordance with the amount of heat generated in the area is disposed. One embodiment to specify the thermal conductivity of the sheet pieces 231 disposed in each of the areas Mx, My, and Mz will be described with reference to FIGS. 3 and 6.

In specifying a thermal conductivity Kz of the sheet piece 231 disposed in the third area Mz (referred to as a "third sheet piece 231z" when distinguished from the other sheet pieces 231), an average generation loss A(W) of the entire parallel flat plate 21 is first estimated on the basis of the average temperature of the entire parallel flat plate 21 and the like. A thermal resistance $\alpha = To/A$ required for the sheet piece 231z is identified from the estimated generation loss A (W) and an allowable rising temperature To (° C.) of the parallel flat plate 21. A relation "$\alpha = d/(Kz \times So)$" is established between the thermal resistance $\alpha$ (° C./W) and the thermal conductivity Kz. "So" is the overall area of the parallel flat plate 21, and "d" is the thickness of the sheet piece 231. And the plurality of sheet pieces 231 all have the same thickness. Therefore, the thermal conductivity Kz (W/m*K) calculated on the basis of this relational formula is used as the thermal conductivity Kz of the third sheet piece 231z.

Then, a thermal conductivity Kx of the sheet piece 231 disposed in the first area Mx (also referred to as a "first sheet piece 231x" when distinguished from the other sheet pieces 231) is specified. In specifying a thermal conductivity Kx of first sheet piece 231x, a generation loss B (W) generated additionally from the average generation loss A in the first area Mx is first estimated on the basis of the difference between the temperature of the first area Mx and the average temperature of the entire parallel flat plate 21, and the like. A thermal resistance $\beta = To/(A+B)$ required for the sheet piece 231x is identified from the estimated additional generation loss B (W) and the allowable rising temperature To (° C.) of the parallel flat plate 21. A relation "$\beta = d/(Kx \times Sx)$" is established between the thermal resistance $\beta$ (° C./W) and the thermal conductivity Kx (where "Sx" is the area of the first area Mx and "d" is the thickness of the sheet piece 231). Therefore, the thermal conductivity Kx (W/m*K) calculated on the basis of this relational formula is used as the thermal conductivity Kx of the first sheet piece 231x.

In addition, a thermal conductivity Ky of the sheet piece 231 disposed in the second area My (also referred to as a "second sheet piece 231y" when distinguished from the other sheet pieces 231) is specified. In specifying a thermal conductivity Ky of second sheet piece 231y, a generation loss C (W) generated additionally from the average generation loss A in the second area My is first estimated on the basis of the difference between the temperature of the second area My and the average temperature of the entire parallel flat plate 21, and the like (in many cases, "C<"). A thermal resistance $\gamma = To/(A+C)$ required for the sheet piece 231y is identified from the estimated additional generation loss C (W) and the allowable rising temperature To (° C.) of the parallel flat plate 21. A relation "$\gamma=d/(Ky \times Sy)$" is established between the thermal resistance $\gamma$ (° C./W) and the thermal conductivity Ky (where "Sy" is the area of the second area My and "d" is the thickness of the sheet piece 231). Therefore, the thermal conductivity Ky (W/m*K) calculated on the basis of this relational formula is used as the thermal conductivity Ky of the second sheet piece 231y.

In this way, a thermal conductivity Ki (i=x, y, z) of each of the first to third sheet pieces 231i (i=x, y, z) is specified on the basis of the amount of heat generated in the area Mi (i=x, y, z) in which the sheet pieces 231i are disposed. According to the above-prescribed embodiment, the amount of heat generated per unit area of each area Mi (i.e., the loss generated per unit area) and the thermal conductivity Ki of the corresponding sheet piece 231i have a proportional relation. Accordingly, if the amount of heat generated per unit area is larger in the order of the first area Mx, the second area My, and the third area Mz, the thermal conductivity of the sheet piece 231 is set to a larger value in the order of the first sheet piece 231x, the second sheet piece 231y, and the third sheet piece 231z, and heat is more easily transferred to the housing 4 in the area where the amount of heat generated is larger. In addition, in the above example, the thermal conductivity Ki of each sheet piece 231i is specified in such a manner that the temperature which is the product of the generation loss and the thermal resistance in each area Mi is the same value. That is, the thermal conductivity Ki of each sheet piece 231i is specified in such a manner that the temperature in each area Mi is equal to each other as a result of the heat amount corresponding to the amount of heat generated being transferred to the housing 4. Accordingly, the unevenness in the amount of heat generated in the plane of the parallel flat plate 21 is appropriately canceled out and the uniformity of the in-plane temperature of the parallel flat plate 21 is sufficiently enhanced. However, since the housing 4 is formed of a material having a sufficiently high thermal conductivity compared to the sheet piece 231, the heat transferred to the housing 4 is quickly equalized therein and dissipated to the outside.

Effect

The smoothing circuit 2 for an inverter according to the above embodiment includes a parallel flat plate 21, a plurality of capacitors 22 arranged in a matrix and mounted on the parallel flat plate 21, and a thermal conductive sheet 23 interposed between the parallel flat plate 21 and a housing 4 in an area overlapping a mounting area 21c of the plurality of capacitors 22 when viewed along a normal direction of the parallel flat plate 21. The plurality of capacitors 22 are arranged in such a manner that adjacent terminals 221 of adjacent capacitors 22 have a same polarity in a row direction and a column direction.

In particular, smoothing circuit 2 for an inverter comprises a parallel flat plate 21 made of laminated busbar or thick copper substrate, a plurality of capacitors 22 arranged in a matrix and mounted on the parallel flat plate 21, and a thermal conductive sheet 23 interposed between the parallel flat plate 21 and a housing 4 in an area overlapping a mounting area 21c of the plurality of capacitors 22 when viewed along a normal direction of the parallel flat plate 21, wherein adjacent terminals 221 of adjacent capacitors 22 (P1), 22 (P2) have a same polarity (221a or 221b) by alternately arranging first posture capacitors 22 (P1) going from the positive terminal 221a to the negative terminal 221b and second posture capacitors 22 (P2) going from the negative terminal 221b to the positive terminal 221a in a predetermined direction (column direction), adjacent terminals 221 of adjacent capacitors 22 (P1 or P2) in a direction (row direction) orthogonal to the predetermined direction (column direction) have the same polarity (221a or 221b) by arranging the first posture capacitor 22 (P1) in a direction (row direction) orthogonal to the predetermined direction (column direction) of the first posture capacitor 22 (P1), and the second posture capacitor 22 (P2) in the direction (row direction) orthogonal to the predetermined direction (column direction) of the second posture capacitor 22 (P2).

Figure 7:
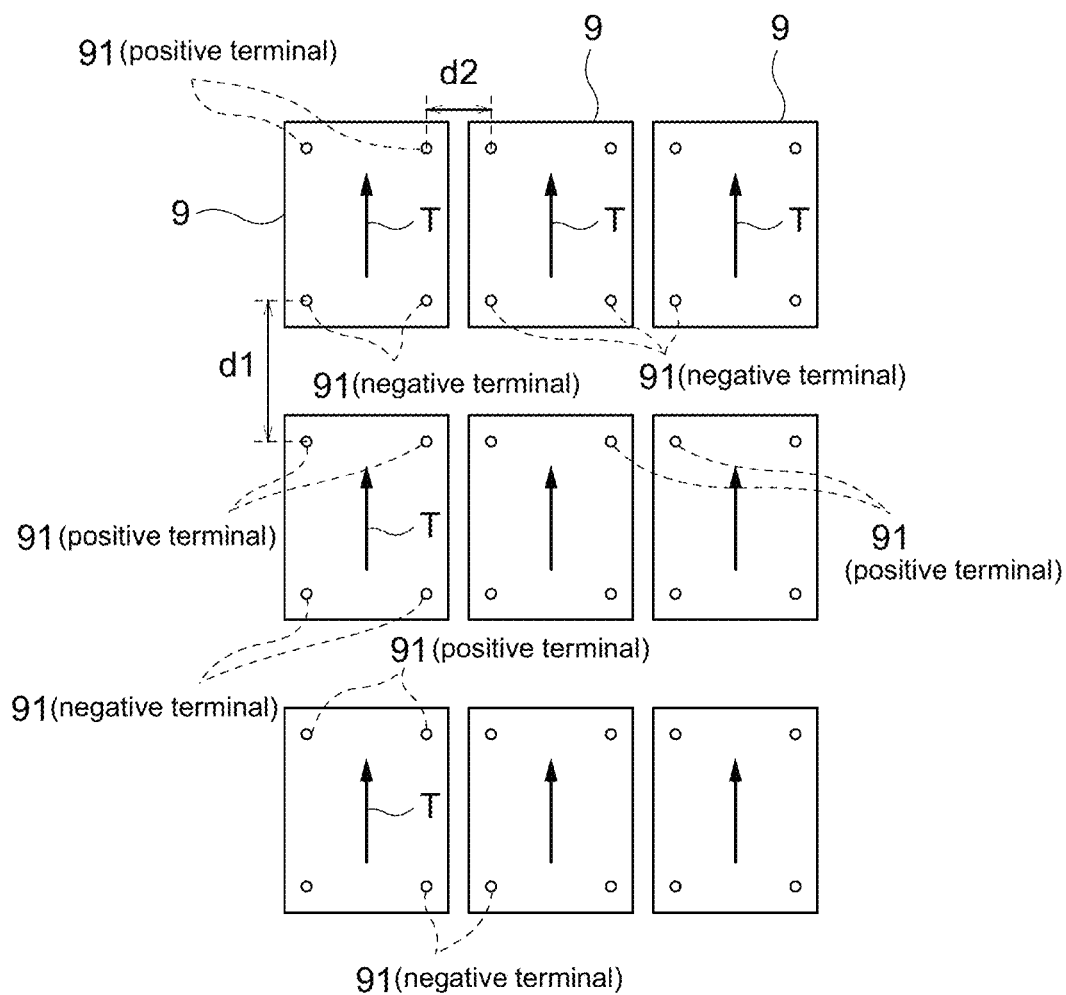
FIG. 7 is a diagram illustrating an arrangement mode of a plurality of capacitors as a comparative example.

For example, as illustrated in FIG. 7, in a case where all of the plurality of capacitors 9 are arranged in a matrix with the same posture (for example, a first posture P1 within the capacitor such that the axial direction T from the negative terminal to the positive terminal is along the column direction and the negative terminal is directed toward the side of the first connection area 21a), adjacent terminals 91 of adjacent capacitors 9 in any one of the row direction or column direction (in the example of FIG. 7, the column direction) have an opposite polarity. In this case, it is necessary to provide, with respect to the direction, a separation distance of a predetermined insulation distance d1 or more between adjacent terminals 91 of the capacitor 9 to ensure the insulation between the different pole terminals. In contrast, in the above configuration, the plurality of capacitors 22 are arranged in such a manner that the polarity of the adjacent terminals 221 of the adjacent capacitors 22 have a same polarity in both the row direction and the column direction. According to this configuration, as illustrated in FIG. 4, it is not necessary to provide such a separation distance of more than a predetermined insulation distance d1 between the terminal 221 of the adjacent capacitors 22 in both the row direction and the column direction, and the provision of a separation distance of more than a predetermined insulation distance d2 for securing insulation between same pole terminals is sufficient (needless to say, "d1>d2"). Accordingly, the density of the plurality of capacitors 22 can be increased, and the mounting area 21c of the plurality of capacitors 22 can be kept small. This makes it possible to keep the size of the thermal conductive sheet 23 small, and thus possible to keep the mass increase resulting from the provision of the thermal conductive sheet 23 to be small. Therefore, sufficient cooling performance can be achieved while suppressing mass increase.

In particular, in a case where the inverter INV in which the smoothing circuit 2 is installed is an inverter for an aircraft, the inverter is expected to be used in a high altitude (i.e., thin air) environment. So the predetermined insulation distance d1 for securing the insulation between the different pole terminals is larger than when the inverter is expected to be used on the ground (e.g., 10 to 20 mm). Since the above configuration does not require such a large insulation distance d1, it is possible to greatly improve the density of the plurality of capacitors 22.

In addition, by increasing the density of the plurality of capacitors 22, the wiring length of the smoothing circuit 2 becomes shorter and the wiring inductance becomes smaller. Therefore, it is also possible to suppress the surge voltage generated during switching in the inverse conversion circuit 3.

In addition, in a case where the inverter INV in which the smoothing circuit 2 is installed is an inverter for an aircraft, it is often not permissible to exhaust the heat generated by the smoothing circuit 2 to the outside of the housing 4 (i.e., inside the aircraft) with the use of a fan. Moreover, an inverter for an aircraft is often disposed in a highly polluted space. In this case, the inside of the housing 4 must be a sealed space, and even in this case, thermal countermeasures using a fan cannot be employed. In this regard, in the above embodiment, since the thermal conductive sheet 23 is used to transfer the heat generated by the capacitor 22 and the parallel flat plate 21 to the housing 4 and dissipate the heat to the outside, the inverter in the above embodiment can be used in a usage environment where a fan cannot be used.

In addition, in the smoothing circuit 2 according to the above embodiment, the thermal conductive sheet 23 includes a plurality of sheet pieces 231 having different thermal conductivities, and a sheet piece having a relatively high thermal conductivity is disposed in an area where an amount of heat generated is relatively large.

In a case where the thermal conductivity of the thermal conductive sheet 23 is specified by the content rate of a thermal conductive filler or the like, the higher the thermal conductivity, the larger the mass. In the above configuration, since the sheet piece 231z having a relatively low thermal conductivity is disposed in the area (e.g., the third area Mz) having a relatively small amount of heat generation among the areas overlapping the mounting area 21c, the total mass of the thermal conductive sheet 23 can be suppressed compared to a case, for example, where a thermal conductive sheet having the thermal conductivity Kx assuming an area having a relatively large amount of heat generation (e.g., the first area Mx) is uniformly disposed in the entire area overlapping the mounting area 21c. In addition, the thermal conductive sheet 23 becomes more expensive as the thermal conductivity is higher. However, according to the above configuration, the cost of the thermal conductive sheet 23 can also be reduced. Furthermore, since a plurality of sheet pieces 231 having different thermal conductivities are used in accordance with the amount of heat generated in each of the areas Mx, My, and Mz, heat is more easily transferred to the housing 4 in the area where the amount of heat generated is larger, and the unevenness in the amount of heat generated in the plane of the parallel flat plate 21 is canceled out and the uniformity of the in-plane temperature of the parallel flat plate 21 is enhanced. By increasing the uniformity of the in-plane temperature of the parallel flat plate 21, it is possible to make the life of the plurality of capacitors 22 mounted thereon uniform, thereby improving the reliability of the product.

In addition, in the smoothing circuit 2 according to the above embodiment, the sheet piece 231x having a relatively high thermal conductivity is disposed in the area (first area) Mx near a connection portion where the parallel flat plate 21 and a semiconductor module 31 are connected.

Since the semiconductor module 31 tends to generate a larger amount of heat compared to the capacitor 22, the vicinity of the semiconductor module 31 tends to receive heat from this and to heat up. In addition, when an alternating current flows between the connection portion of the semiconductor module 31 and the parallel flat plate 21, a loss corresponding to the effective value of the alternating current is generated therein, and thus the temperature of the connection portion and its vicinity is likely to rise. According to the above configuration, since the sheet piece 231x having a relatively high (large) thermal conductivity is disposed in the first area Mx which is an area near the connection portion where the parallel flat plate 21 and the semiconductor module 31 are connected, it is possible to effectively dissipate the heat generated in the near area Mx.

One of the causes of the large amount of heat generation in the first area Mx is the large generation loss. Therefore, for example, the thickness of the copper foil provided on the parallel flat plate 21 may be increased to reduce the generation loss. However, if this is done, an increase in the mass of the parallel flat plate 21 is unavoidable. In other words, according to the above configuration, it is possible to suppress the local temperature rise in an area where the generation loss is large, without increasing the mass of the parallel flat plate 21.

In addition, another cause of the large heat generation in the first area Mx is that the first area Mx receives heat from the semiconductor module 31. Therefore, for example, it is conceivable to provide a connection site of the semiconductor module 31 (i.e., the connection piece 211) at a position away from the mounting area 21c to reduce the effect of heat received from the semiconductor module 31. However, if this is done, an increase in the size of the parallel flat plate 21 is unavoidable. In other words, according to the above configuration, it is possible to suppress the local temperature rise due to receiving heat from the semiconductor module 31, without increasing the size of the parallel flat plate 21.

In addition, in the smoothing circuit 2 according to the above embodiment, the plurality of capacitors 22 are of a same type as each other, and the sheet piece 231y having a relatively high thermal conductivity is disposed in an area corresponding to the area (second area) My where a capacitor 22 surrounded by other capacitors 22 is mounted.

As described above, the plurality of capacitors 22 are arranged in such a manner that the adjacent terminals 221 of the adjacent capacitors 22 have the same polarity in both the row direction and the column direction, and it is thereby possible to increase the density of the plurality of capacitors 22. However, when the density of the plurality of capacitors 22 is increased, it becomes difficult for the heat generated by the capacitor 22 surrounded by other capacitors 22 to be dissipated to the surroundings. According to the above configuration, since the sheet piece 231y having a relatively high thermal conductivity is disposed in the second area My which is an area corresponding to the area where such a capacitor 22 is mounted, it is possible to effectively dissipate the heat generated in the capacitor 22.

The cause of the large amount of heat generation in the second area My is that the capacitor 22 surrounded by other capacitors 22 is difficult to dissipate heat. Therefore, for example, the separation distance between adjacent capacitors 22 may be increased in such a manner that sufficient heat is dissipated even from such capacitor 22. Needless to say, however, this means that the density of the capacitors 22 is reduced. In other words, according to the above configuration, it is possible to suppress local temperature rise in the area where the capacitors 22 are gathering while maintaining a high density of the capacitors 22.

In addition, in the smoothing circuit 2 according to the above embodiment, a thermal conductivity $K_i$ (i=x, y, z) of each of the plurality of sheet pieces $231i$ (i=x, y, z) is specified on the basis of the amount of heat generated in the area $M_i$ (i=x, y, z) in which the sheet pieces $231i$ are disposed.

According to this configuration, the unevenness in the amount of heat generated in the plane of the parallel flat plate 21 is appropriately canceled out, and thus the uniformity of the in-plane temperature of the parallel flat plate 21 is sufficiently enhanced.

In addition, the smoothing circuit 2 according to the above embodiment is mounted on an inverter INV for an aircraft.

While high cooling performance is required for the inverter INV for an aircraft, weight reduction is also strongly required. The smoothing circuit 2 according to the above embodiment can meet both of these requirements because sufficient cooling performance is achieved while suppressing the mass increase.

Other Embodiments

In the above embodiment, the thermal conductive sheet 23 includes the plurality of sheet pieces 231x, 231y, and 231x having different thermal conductivities, but all of the plurality of sheet pieces 231 constituting the thermal conductive sheet 23 may have the same thermal conductivity. That is, a plurality of sheet pieces 231 having equal thermal conductivity may be arranged evenly at the same pitch throughout the area overlapping the mounting area 21c when viewed along the normal direction of the parallel flat plate 21. In addition, in the above embodiment, the thermal conductive sheet 23 includes a plurality of sheet pieces 231, but the thermal conductive sheet 23 may be made of a single sheet. That is, a single sheet may be disposed in such a manner that the entire area overlapping the mounting area 21c when viewed along the normal direction of the parallel flat plate 21 is covered.

According to each of the above configurations, although even the unevenness of the temperature cannot be suppressed, it is similar to the above embodiment in that the heat generated by each of the capacitors 22 and the parallel flat plates 21 is quickly transferred to the housing 4 through each of the sheet pieces 231 and is dissipated to the outside. Therefore, even in these configurations, the temperature rise of each capacitor 22 and parallel flat plate 21 can be suppressed.

In the above embodiments, the number of the sheet pieces 231 arranged in each of the areas Mx, My, and Mz is not limited to those illustrated in the figures. For example, the sheet pieces 231x, 231y, and 231z disposed in each of the areas Mx, My, and Mz may include a single sheet piece such that each sheet piece is congruent with the area where the sheet piece is disposed, or may include a plurality of sheet pieces that are sufficiently small compared to the area.

In the above embodiment, the area where the thermal conductive sheet 23 is arranged is divided into three types of areas Mx, My, and Mz in accordance with the amount of heat generated, but the mode of dividing the area is not limited to this. For example, in the above embodiment, the area corresponding to the area where the capacitor 22 surrounded by eight capacitors 22 is mounted is used as the second area My. However, for example, the area corresponding to the area where the capacitor 22 surrounded by seven or more capacitors 22 is mounted may be used as the second area My. In addition, for example, the third area Mz may be further divided into an area on a side near the second connection portion 21b and an area on a side near a first connection portion 21a. As the total number of areas to be divided increases, the number of sheet pieces 231 included in the thermal conductive sheet 23 whose thermal conductivity differs from each other increases, thereby making it possible to increase the uniformity of the in-plane temperature of the parallel flat plate 21.

In the above embodiment, the thermal conductivity of each sheet piece 231i is adjusted by the content rate of a thermal conductive filler or the like, but the thermal conductivity may be adjusted by the area of each sheet piece 231i (the area ratio of the sheet piece 231i to the area Mi where each sheet piece 231i is disposed).

In the above embodiment, the parallel flat plate 21 provided in the smoothing circuit 2 includes a laminated busbar, but the parallel flat plate 21 is not limited to the laminated busbar. For example, the parallel flat plate 21 may include a substrate capable of handling high currents, for example, a thick copper substrate.

In the above embodiment, the total number of capacitors 22 provided in the smoothing circuit 2 may be any number. In addition, the number of arrays of the capacitors 22 in each of the row direction and the column direction may also be any number. Moreover, the type of the capacitor 22 is not limited to a film capacitor, but may also be a ceramic capacitor, an electrolytic capacitor, or the like.

In the above embodiment, the inverter INV is connected to the alternating current power supply AC, but the inverter may be connected to a battery. In this case, the inverter can be configured to include the smoothing circuit 2 and the inverse conversion circuit 3, without including the rectifier circuit 1. In this case, the smoothing circuit 2 is connected to the battery. The direct current power given from the battery is smoothed by the smoothing circuit 2 and given to the inverse conversion circuit 3. The inverse conversion circuit 3 converts the given direct current power into alternating current power and outputs same to the fan motor for propulsion M and the like. If the inverter has such a configuration, the battery is connected to the first connection area 21a of the parallel flat plate 21 of the smoothing circuit 2.

In addition, in the above embodiment, the smoothing circuit 2 is a smoothing circuit for an inverter installed in an inverter INV for driving a fan motor for propulsion of an aircraft, but the smoothing circuit may be installed in various other inverters. In particular, it is effective to apply the smoothing circuit 2 to an inverter that requires sufficient cooling performance while suppressing mass increase.

Other configurations can be varied to the extent that they do not depart from the purpose of the present invention.

DESCRIPTION OF REFERENCE NUMERALS

INV inverter
1 rectifier circuit
2 smoothing circuit for an inverter (smoothing circuit)
21 parallel flat plate
21c mounting area
22 capacitor
221 terminal
23 thermal conductive sheet
231, 231x, 231y, 231z sheet piece
3 inverse conversion circuit
31 semiconductor module
4 housing
41 bottom surface

What is claimed is:

1. A smoothing circuit for an inverter, the smoothing circuit comprising:
   a parallel flat plate made of laminated busbar or thick copper substrate;
   a plurality of capacitors arranged in a matrix and mounted on the parallel flat plate; and
   a thermal conductive sheet interposed between the parallel flat plate and a housing in an area overlapping a mounting area of the plurality of capacitors when viewed along a normal direction of the parallel flat plate,
   wherein adjacent terminals of adjacent capacitors have a same polarity by alternately arranging first posture capacitors within the capacitor going from a positive terminal to a negative terminal and second posture capacitors within the capacitor going from the negative terminal to the positive terminal in a predetermined direction, and the adjacent terminals of the adjacent capacitors in a direction orthogonal to the predetermined direction have the same polarity by arranging the first posture capacitor in a direction orthogonal to the predetermined direction of the first posture capacitor, and the second posture capacitor in the direction orthogonal to the predetermined direction of the second posture capacitor, and wherein the sheet piece having the relatively high thermal conductivity is disposed in an area near a connection portion where the parallel flat plate and a semiconductor module are connected, and the sheet piece having the relatively low thermal conductivity is disposed in an area away from the connection portion.

2. The smoothing circuit for the inverter according to claim 1,
wherein the thermal conductive sheet includes a plurality of sheet pieces having different thermal conductivities, and
a sheet piece having a relatively high thermal conductivity is disposed in an area where an amount of heat generated is relatively large.

3. The smoothing circuit for the inverter according to of claim 1,
wherein the plurality of capacitors are of a same type as each other, and
the sheet piece having the relatively high thermal conductivity is disposed in an area corresponding to an area where a capacitor surrounded by other capacitors arranged adjacent to the predetermined direction and the direction orthogonal to the predetermined direction are mounted.

4. A smoothing circuit for an inverter, the smoothing circuit comprising:
a parallel flat plate made of laminated busbar or thick copper substrate;
a plurality of capacitors arranged in a matrix and mounted on the parallel flat plate; and
a thermal conductive sheet interposed between the parallel flat plate and a housing in an area overlapping a mounting area of the plurality of capacitors when viewed along a normal direction of the parallel flat plate,
wherein adjacent terminals of adjacent capacitors have a same polarity by alternately arranging first posture capacitors within the capacitor going from a positive terminal to a negative terminal and second posture capacitors within the capacitor going from the negative terminal to the positive terminal in a predetermined direction, and
the adjacent terminals of the adjacent capacitors in a direction orthogonal to the predetermined direction have the same polarity by arranging the first posture capacitor in a direction orthogonal to the predetermined direction of the first posture capacitor, and the second posture capacitor in the direction orthogonal to the predetermined direction of the second posture capacitor,
wherein the thermal conductive sheet includes a plurality of sheet pieces having different thermal conductivities, and
a sheet piece having a relatively high thermal conductivity is disposed in an area where an amount of heat generated is relatively large, wherein the sheet piece having the relatively high thermal conductivity is disposed in an area near a connection portion where the parallel flat plate and a semiconductor module are connected, and
wherein the connection portion to which the semiconductor module is connected is arranged in an uneven portion provided in the housing.

5. An inverter for an aircraft propulsion motor, the inverter comprising the smoothing circuit for the inverter according to claim 4,
wherein parallel flat plates are composed of laminated bus bars or thick copper substrates.

6. The smoothing circuit for the inverter according to claim 2,
wherein a thermal conductivity of each of the plurality of sheet pieces is specified on a basis of an amount of heat generated in an area where the sheet pieces are disposed.

7. The smoothing circuit for the inverter according to claim 1,
wherein the thermal conductive sheet is a substance in which a thermally conductive additive (filler) is mixed with an insulating base material such as a silicone polymer.

8. An inverter for an aircraft, the inverter comprising the smoothing circuit for the inverter according to claim 1,
wherein parallel flat plates are composed of laminated bus bars or thick copper substrates.

9. A smoothing circuit for an inverter, the smoothing circuit comprising:
a parallel flat plate made of laminated busbar or thick copper substrate;
a plurality of capacitors arranged in a matrix and mounted on the parallel flat plate; and
a thermal conductive sheet interposed between the parallel flat plate and a housing in an area overlapping a mounting area of the plurality of capacitors when viewed along a normal direction of the parallel flat plate,
wherein adjacent terminals of adjacent capacitors have a same polarity by alternately arranging first posture capacitors within the capacitor going from a positive terminal to a negative terminal and second posture capacitors within the capacitor going from the negative terminal to the positive terminal in a predetermined direction,
adjacent terminals of adjacent capacitors in a direction orthogonal to the predetermined direction have the same polarity by arranging the first posture capacitor in a direction orthogonal to the predetermined direction of the first posture capacitor, and the second posture capacitor in the direction orthogonal to the predetermined direction of the second posture capacitor,
wherein the plurality of capacitors are of a same type as each other, and
a sheet piece having a relatively high thermal conductivity is disposed in an area corresponding to an area where a capacitor surrounded by other capacitors is mounted,
wherein the thermal conductive sheet includes a plurality of sheet pieces having different thermal conductivities,
wherein the sheet piece having the relatively high thermal conductivity is disposed in an area where an amount of heat generated is relatively large,
the thermal conductive sheet is a substance in which a thermally conductive additive (filler) is mixed with an insulating base material such as a silicone polymer, wherein the sheet piece having the relatively high thermal conductivity is disposed in an area near a connection portion where the parallel flat plate and a semiconductor module are connected, wherein a thermal conductivity of each of the plurality of sheet pieces is specified on a basis of an amount of heat generated in an area where the sheet pieces are disposed, and wherein there are three types of conductive sheets corresponding to a first area where the semiconductor module is connected, a second area where the capacitor is mounted and which is surrounded by other capacitors, and a third area excluding the first area and the second area.

10. An inverter for an aircraft, the inverter comprising the smoothing circuit for the inverter according to claim 9.

11. The smoothing circuit for the inverter according to claim 1,
wherein the thermal conductive sheet includes a plurality of sheet pieces having different thermal conductivities, and a sheet piece having a relatively high thermal conductivity is disposed in an area where an amount of heat generated is relatively large, wherein the sheet piece having the relatively high thermal conductivity is disposed in an area near a connection portion where the parallel flat plate and a semiconductor module are connected, wherein the plurality of capacitors are of a same type as each other, and the sheet piece having the relatively high thermal conductivity is disposed in an area corresponding to an area where a capacitor surrounded by other capacitors is mounted, and, wherein the connection portion to which the semiconductor module is connected is arranged in an uneven portion provided in the housing.

12. An inverter for an aircraft propulsion motor, the inverter comprising the smoothing circuit for the inverter according to claim 1, wherein parallel flat plates are composed of laminated bus bars or thick copper substrates.

13. The smoothing circuit for the inverter according to claim 1, wherein a thermal conductivity of each of the plurality of sheet pieces is specified on a basis of an amount of heat generated in an area where the sheet pieces are disposed.

14. The smoothing circuit for an inverter according to claim 1,
wherein the conductive sheet arranged in the region near the connection part where the parallel plate and the semiconductor module are connected has a relatively higher thermal conductivity than the conductive sheet arranged in the part where the capacitors are arranged.

15. The smoothing circuit for an inverter according to claim 1,
wherein there are three types of conductive sheets corresponding to a first area where the semiconductor module is connected,
a second area where the capacitor which is surrounded by other capacitors is mounted, and
a third area excluding the first area and the second area.

* * * * *